(12) United States Patent
Lin

(10) Patent No.: US 7,164,586 B2
(45) Date of Patent: Jan. 16, 2007

(54) PLASMA DISPLAY

(75) Inventor: Yu-Kai Lin, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 169 days.

(21) Appl. No.: 10/792,231

(22) Filed: Mar. 3, 2004

(65) Prior Publication Data

US 2005/0124221 A1 Jun. 9, 2005

(30) Foreign Application Priority Data

Dec. 5, 2003 (TW) .............................. 92134310 A

(51) Int. Cl.
*H05K 7/20* (2006.01)
(52) U.S. Cl. ...................... 361/714; 361/707; 348/794
(58) Field of Classification Search ................ 361/707, 361/687, 704, 714; 248/510, 917–924; 24/458; 348/14.07, 552, 789, 794, 836–843
See application file for complete search history.

(56) References Cited

U.S. PATENT DOCUMENTS

| | | | | |
|---|---|---|---|---|
| 4,442,450 A * | 4/1984 | Lipschutz et al. | .......... | 257/713 |
| 4,689,720 A * | 8/1987 | Daszkowski | ................ | 361/704 |
| 5,268,815 A * | 12/1993 | Cipolla et al. | .............. | 361/704 |
| 5,287,001 A * | 2/1994 | Buchmann et al. | ......... | 257/719 |
| 5,971,566 A * | 10/1999 | Tani et al. | ................... | 362/294 |
| 6,043,981 A * | 3/2000 | Markow et al. | ............ | 361/704 |
| 6,049,469 A * | 4/2000 | Hood et al. | .................. | 361/818 |
| 6,381,124 B1 * | 4/2002 | Whitcher et al. | ........... | 361/681 |
| 6,388,189 B1 * | 5/2002 | Onoue | ........................ | 174/383 |
| 6,504,713 B1 * | 1/2003 | Pandolfi et al. | ............. | 361/695 |
| 6,870,738 B1 * | 3/2005 | Goebl | ......................... | 361/719 |
| 2003/0020152 A1 * | 1/2003 | Inoue et al. | ................ | 257/684 |
| 2003/0068487 A1 * | 4/2003 | Nguyen et al. | ............. | 428/323 |
| 2005/0078446 A1 * | 4/2005 | Bae | ............................. | 361/687 |

FOREIGN PATENT DOCUMENTS

| | | |
|---|---|---|
| JP | 11-233968 | 8/1999 |
| JP | 2000-182445 | 6/2000 |
| JP | 2001337612 | 7/2001 |

OTHER PUBLICATIONS

Machine translation of the detailed description and of the description of the drawings of JP/2002-006754, Japanese Patent Office (http://www4.ipdl.ncipi.go.jp/Tokujitu/PAJdetail.ipdl?N0000=60&N0120=01&N3001=2002-006754).*
China Office Action mailed Jun. 2, 2006.

* cited by examiner

*Primary Examiner*—Anatoly Vortman
(74) *Attorney, Agent, or Firm*—Thomas, Kayden, Horstemeyer & Risley

(57) ABSTRACT

A plasma display. The plasma display comprises a first circuit board and a second circuit board disposed in a space formed by a base plate and a back cover thereof. The first circuit board is mounted on the base plate and bears a first electronic element, the second circuit board is mounted on the first circuit board and bears a second electronic element requiring heat dissipation different from the first electronic element. A thermal conductive device is disposed between the second electronic element and the back cover to dissipate heat from the second electronic element to the back cover. Thereby, the electronic elements requiring different heat dissipation are positioned in divided areas to enhance heat dissipation efficiency.

15 Claims, 7 Drawing Sheets

PLASMA DISPLAY

BACKGROUND OF THE INVENTION

1. Field of the Invention

The present invention relates to a plasma display, and in particular to a plasma display having divided areas for divers electronic elements requiring heat dissipation.

2. Description of the Related Art

A display panel, electronic elements and driver modules in a driver circuit are main heat sources of a plasma display. In a conventional plasma display, as shown in FIG. 1, a display panel 10 is secured to a metal base plate 30 via a thermal pad 20. The base plate 30 and the back cover 40 of the plasma display form a closed space accommodating a circuit board 100. Heat produced by the display panel 10 is conducted to the metal back cover 40 via the thermal pad 20 and base plate 30 for dissipation. Heat from a driver module 120 and an electronic element 140 is evacuated by airflow L via a vent 180 and a fan 190 to the exterior. In general, the driver module 120 requires more heat dissipation than the electronic element 140.

In this structure, as the driver module 120 and the electronic element 140 are disposed on the same circuit board 100, the space and path for heat dissipation may not be sufficient, therefore, the plasma display may develop an unacceptable high temperature.

Accordingly, Japan patent JP2002-6754 discloses a plasma display as shown in FIG. 2. A display panel 10 is secured to a base plate 30 via a thermal pad 20. The base plate 30 and a back cover 40 of the plasma display form a closed space accommodating a first circuit board 200 fixed to the base plate 30 and a second circuit board 250 fixed to a frame 230 bonded to the back cover 40 via a thermal conductive element 270. The first circuit board 200 bears an electronic element 240, and the second circuit board 250 bears an electronic element 242 on one side and a driver module 220 on the other. The heat sink (not shown) of the driver module 220 contacts the frame 230, such that the heat from the driver module 220 is conducted to the back cover 40 via the frame 230 and the thermal conductive element 270.

In this condition, although the electronic element 242 and the driver module 220 are disposed on the second circuit board 250, as the second circuit board 250 is disposed on the back cover 40, the power cable of the second circuit board 250 is difficult to secure before the back cover 40 is mounted. Moreover, although the heat from driver module 220 is conducted by the contact between the driver module 220 and the frame 230, the contact area is not large enough for good conduction. In addition, due to the large, thin and easily deformed back cover 40, the frame 230 is fixed to the back cover 40 only via the thermal conductive element 270 further reducing the thermal contact area in the structure.

SUMMARY OF THE INVENTION

Accordingly, an object of the invention is to provide divided areas for electronic elements with divers heat dissipation requirements.

Another object of the invention is to provide a dedicated thermal conductive device for electronic elements requiring large heat dissipation.

The plasma display of the invention comprises a base plate, a back cover engaged with the base plate to form a space, a first circuit board disposed in the space and mounted on the base plate, a first electronic element disposed on the first circuit board and a first thermal conductive device disposed between the first electronic element and the back cover and mounted on the first electronic element.

The first thermal conductive device comprises a thermal conductive spring element of copper. The thermal conductive spring element has a spring portion secured to the first electronic element and a contact portion abutting the back cover. The spring portion can be integrally formed with the contact portion.

The plasma display further comprises a plurality of first supporters disposed between the first circuit board and the base plate to separate the first circuit board from the base plate by an appropriate distance. A second electronic element can be disposed on the first circuit board but opposite to the first electronic element.

The plasma display further comprises a second circuit board mounted between the first circuit board and the base plate, and a third electronic element disposed on the second circuit board.

The plasma display further comprises a fourth electronic element disposed on the first circuit board and a second thermal conductive device disposed between the fourth electronic element and the back cover and mounted on the fourth electronic element. In this structure, the first thermal conductive device can be a thermal pad, and the second thermal device can be a thermal conductive spring element as described above.

In the invention, electronic elements with different heat dissipation requirements are disposed in different areas and a dedicated heat dissipation device is provided for these electronic elements requiring increased heat dissipation. Thus, the overall dissipation efficiency of the plasma display is enhanced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
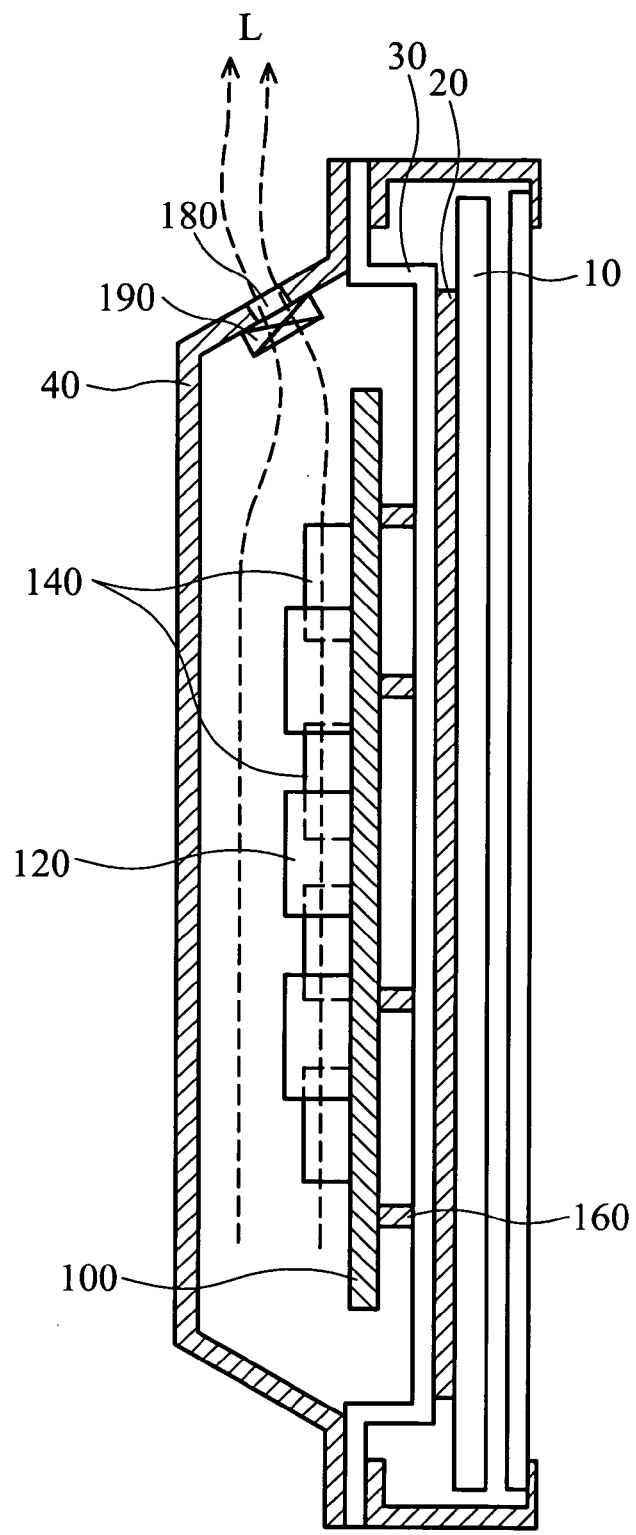
FIG. 1 is a cross section of a conventional plasma display as referenced in the Related Art.
Figure 2:
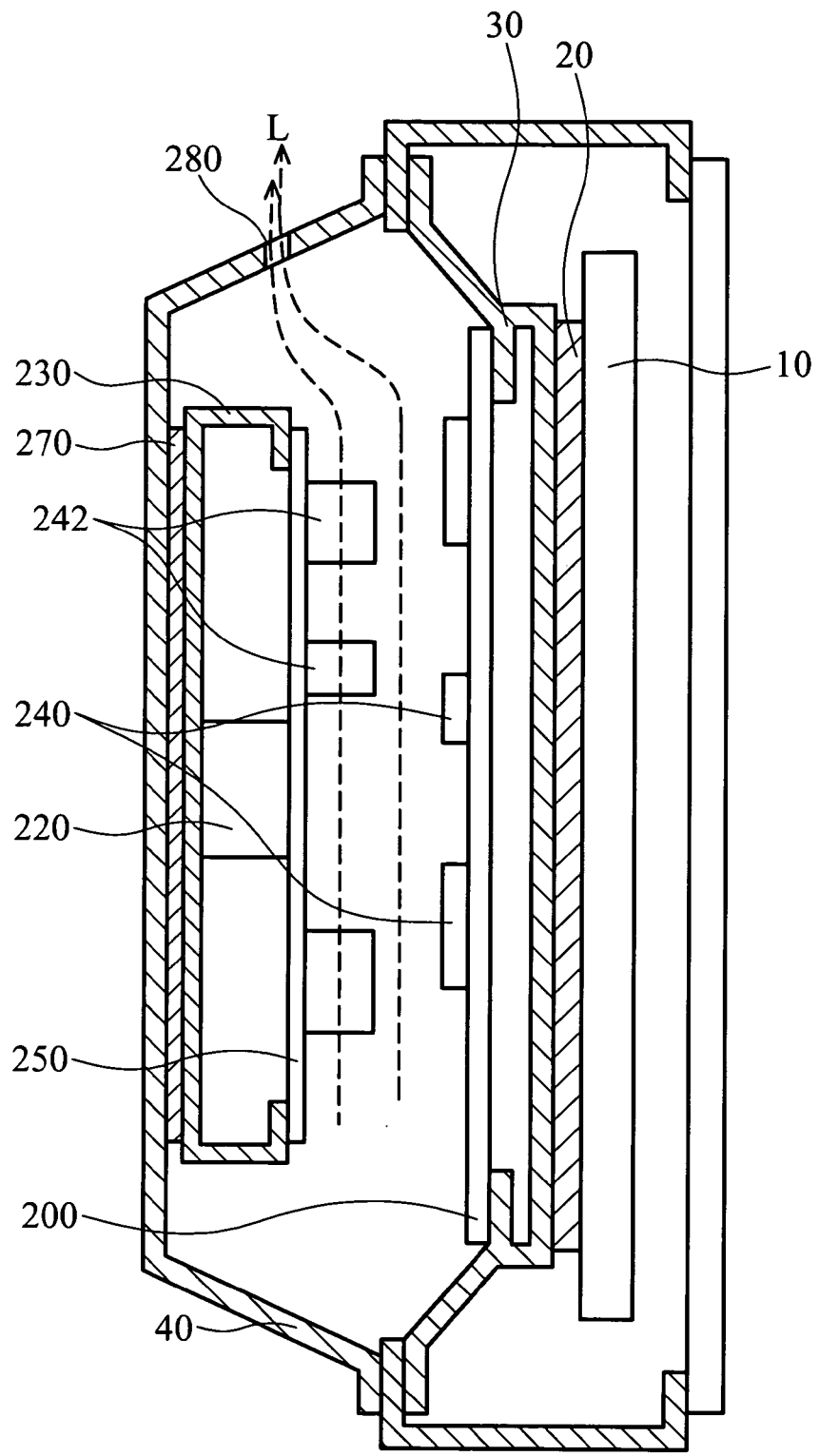
FIG. 2 is a cross section of another conventional plasma display as referenced in the Related Art.
Figure 3:
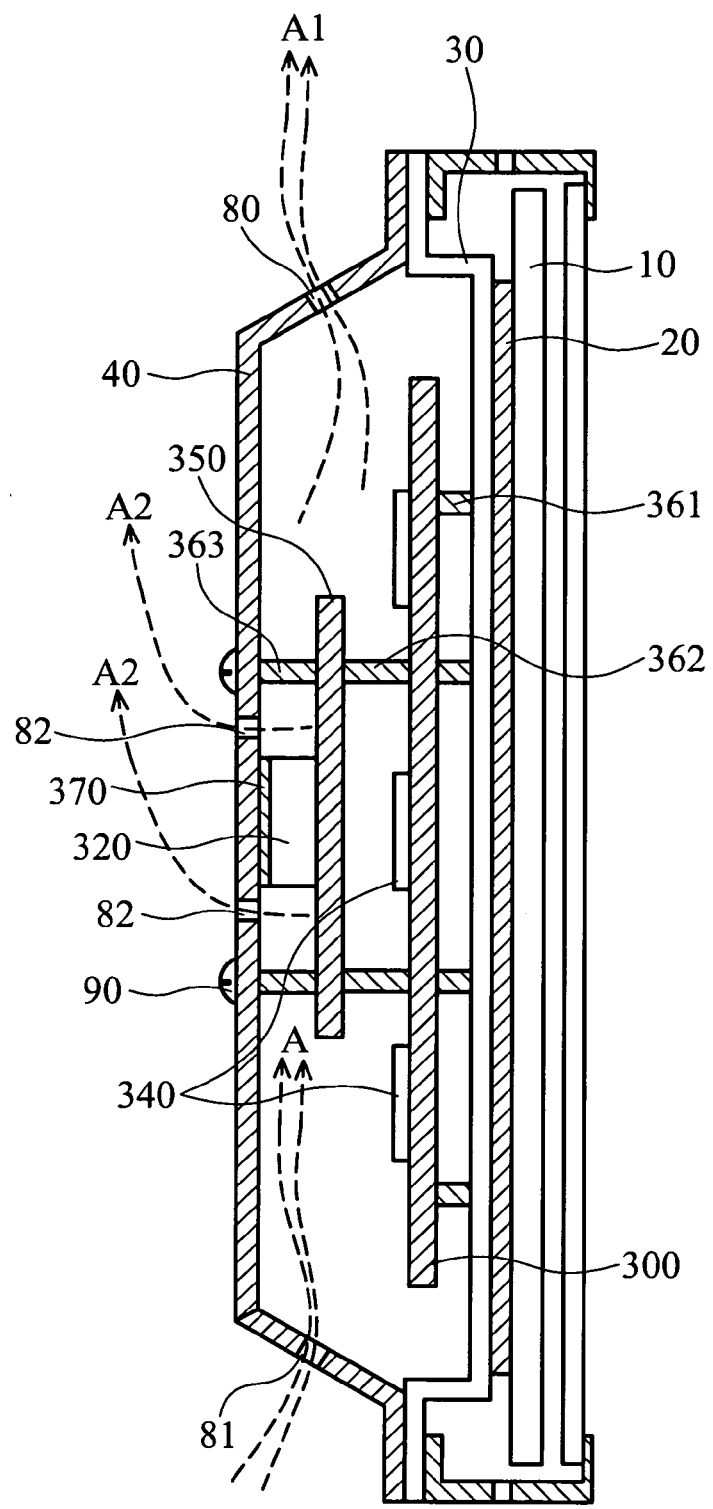
FIG. 3 is a cross section of the first embodiment of the plasma display of the invention.

In the plasma display of the invention, electronic elements requiring heat dissipation are disposed in divided areas. The back cover of the plasma display also enhances heat dissipation in the invention. A detailed description is given in the following embodiments First Embodiment As shown in FIG. 3, a first circuit board 350 and a second circuit board 300 are accommodated in a space formed by a metal back cover 40 and a base plate 30 of the plasma display. The second circuit board 300 is secured to the base plate 30 via a plurality of supporters 361 and the first circuit board 350 is secured to the second circuit board 300 via a plurality of supporters 362, such that the second circuit board 300 is separated from the first circuit board 350 by an appropriate distance for bearing an electronic element (the third electronic element) 340 thereon. The first circuit board 350 is separated from the back cover 40 by supporter 363 to maintain an appropriate distance therebetween for bearing a driver module (the first electronic element) 320 thereon. As the driver module 320 gives out more heat than the electronic element 340, the driver module 320 makes thermal contact with the back cover 40 via a thermal pad 370 (no adhesive) for heat dissipation by means of the large area of the back cover 40. As the back cover 40 is fixed to the first circuit board 350 by a structure including bolts 90 and supporters 363, the thermal pad 370 is pressed tightly between the driver module 320 and the back cover 40 when bolt 90 is mounted to reduce thermal resistance therebetween.

In addition, a plurality of vents 80, 81 is defined on the back cover 40 for outlet of airflow therethrough by natural convection. A vent 82 can be also defined on the back cover 40 near the location of the driver module 320 to improve the dissipation efficiency.

Thus, airflow A enters the plasma display via the vent 81 on the bottom of the back cover 40 and is divided into A1 and A2. Airflow A2 passes through the space in which the driver module 320 is positioned to absorb the heat therefrom and dispel outward. Airflow A1 passes the electronic element 340 and discharges outward via the vent 80 on the top of the back cover 40.

Thereby, driver module 320 producing more heat is disposed on the first circuit board 350 and near the vents 80, 81 to provide more airflow and make thermal contact with the back cover 30 to improve heat dissipation. The electronic element 340 producing less heat, receives less airflow. In this condition, driver module 320 and electronic element 340 are disposed in separated areas to improve heat dissipation efficiency.

Second Embodiment

Figure 4:
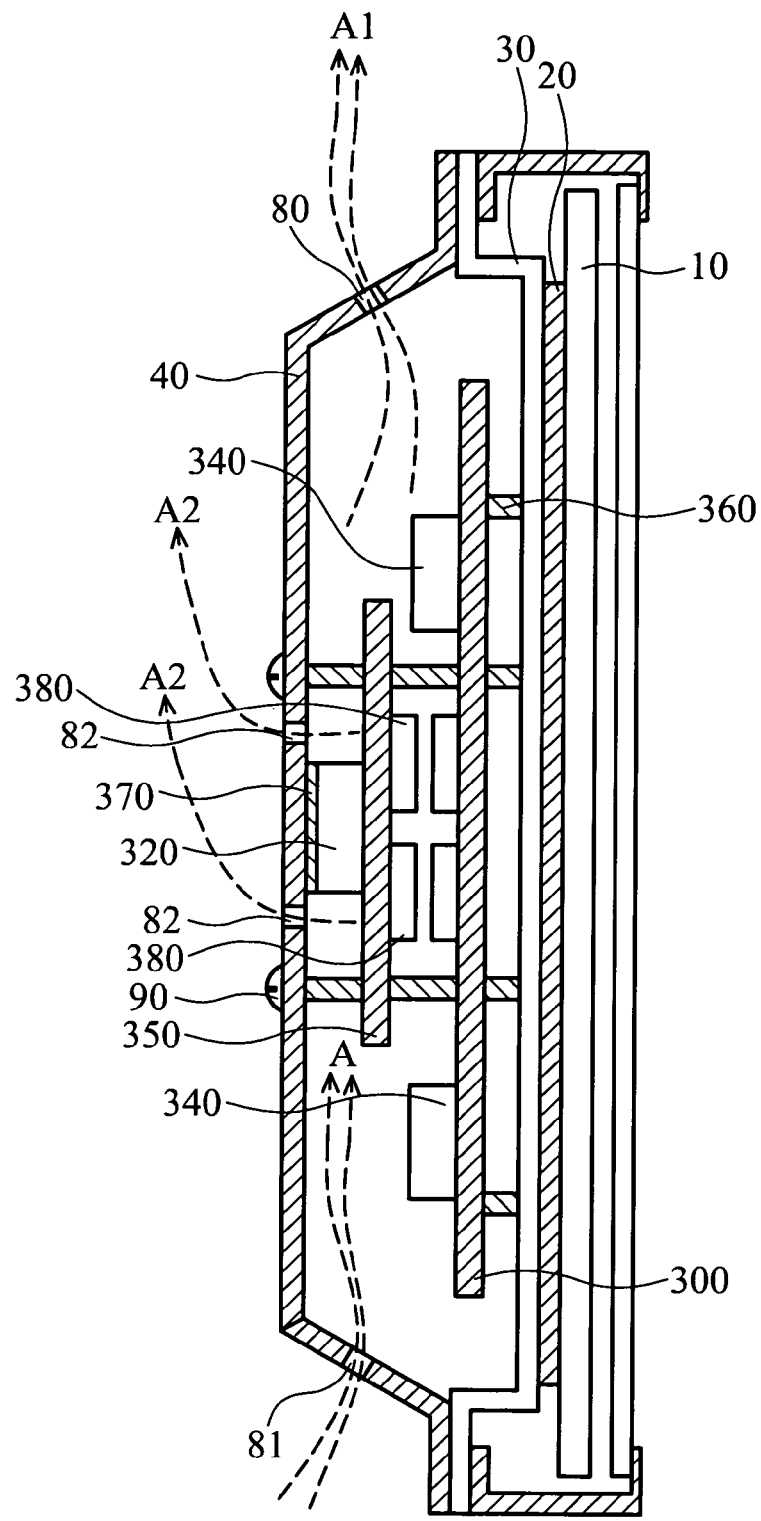
FIG. 4 is a cross section of the second embodiment of the plasma display of the invention.

As shown in FIG. 4, according to the structure in the first embodiment, the distance between the first circuit board 350 and the second circuit board 300 is large enough to accommodate electronic element (the fifth electronic element) 380 on the rear of the first circuit board. Other structures are the same as the first embodiment. Thus, space for electronic elements on the circuit board is increased.

Third Embodiment

Figure 5:
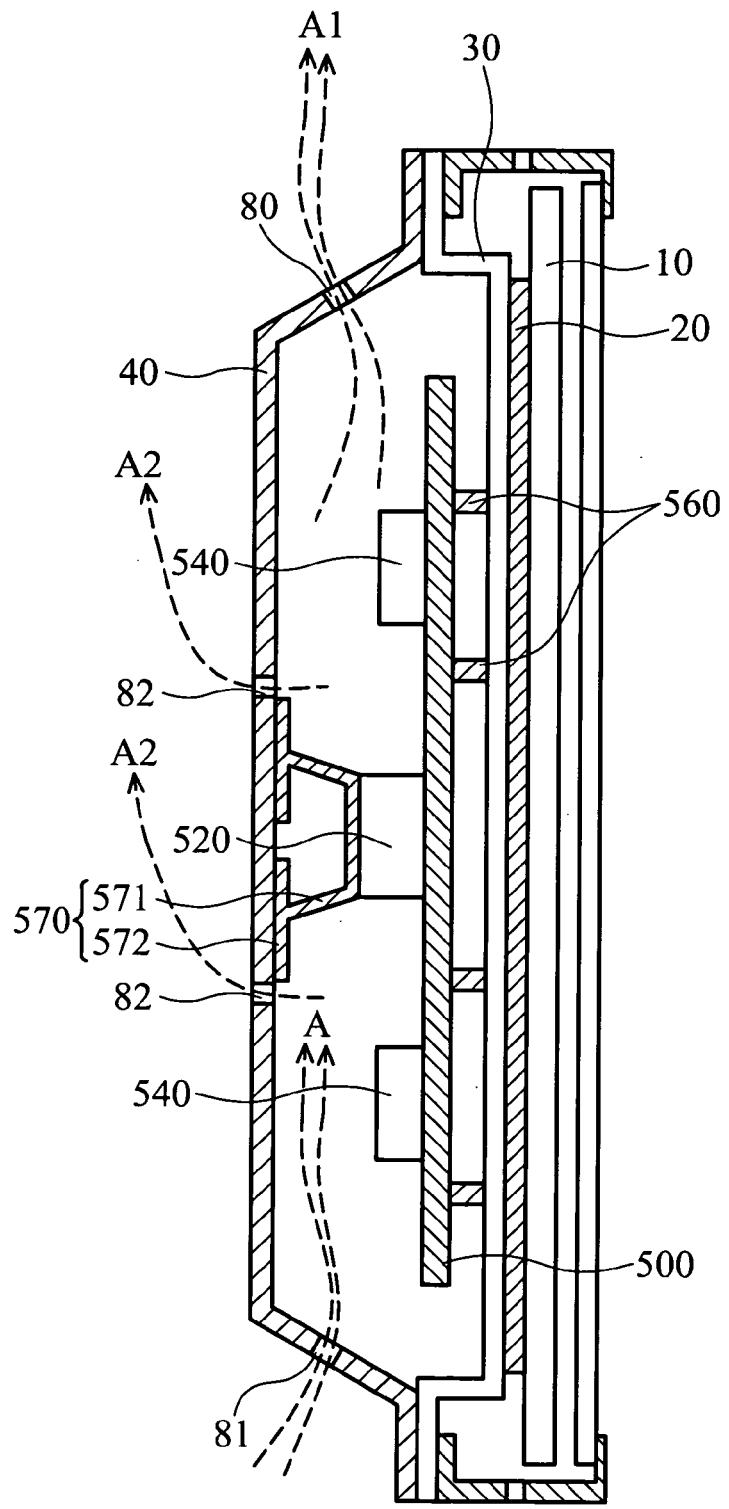
FIG. 5 is a cross section of the third embodiment of the plasma display of the invention.

As shown in FIG. 5, a circuit board 500 is secured on the base plate 300 via a supporter 560 and bears a driver module 520 and an electronic element 540, wherein the driver module 520 makes thermal contact with the back cover 40 by a thermal conductive spring element 570 of copper. The heat from the driver module 520 is conducted to the back cover 40 via the thermal conductive spring element 570 to improve dissipation efficiency. The thermal conductive spring element 570 includes a spring portion 571 and a contact portion 572. The spring portion 571 and the contact portion 572 can be integrally formed. The spring portion 571 is configured in a U shape, the legs of which can be elastically deformed. The contact portion 572 is a plate abutting the back cover 40 by the resilient force of spring portion 571. The spring portion 571 provides various options in designing the distance from the driver module 520 to the back cover 40.

In this embodiment, although the driver module 520 and the electronic element 540 are not disposed in divided areas, the design of the thermal conductive spring element 570 provides another aspect for improving heat dissipation efficiency.

Fourth Embodiment

Figure 6:
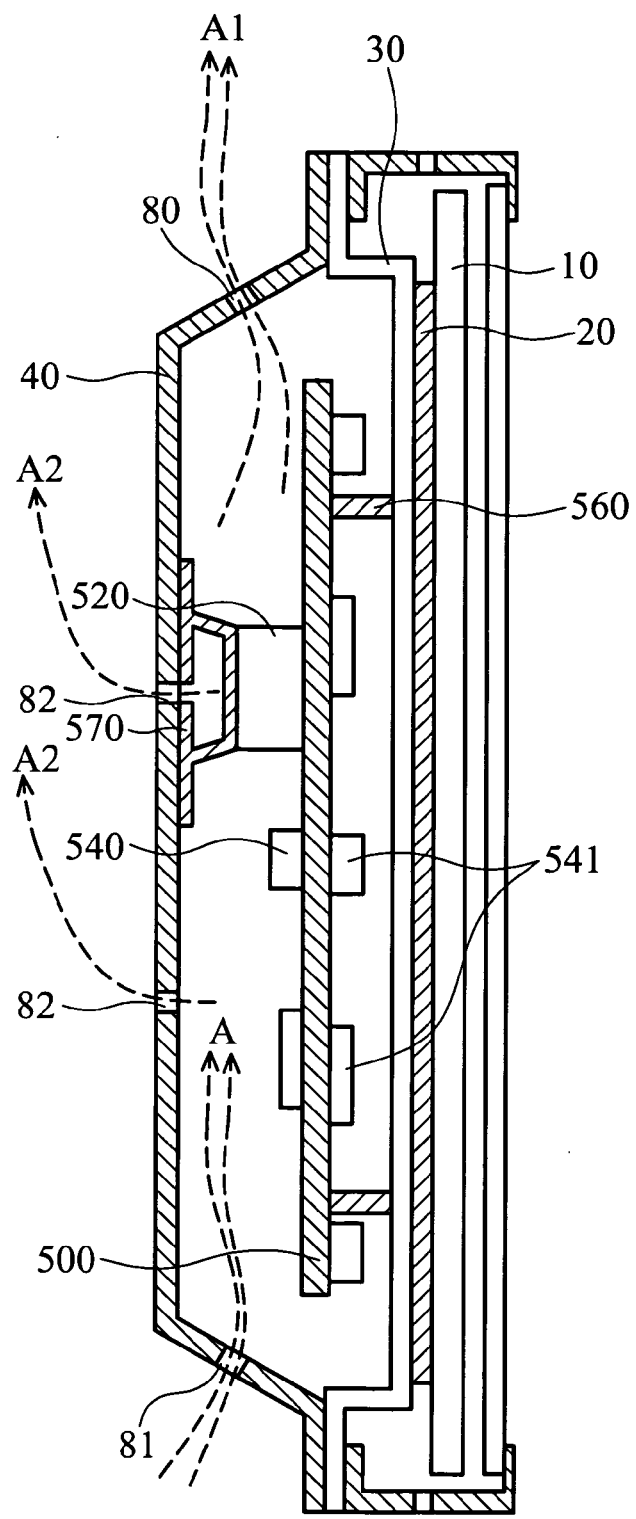
FIG. 6 is a cross section of the fourth embodiment of the plasma display of the invention.

As shown in FIG. 6, according to the third embodiment, electronic elements 541 are disposed on the back of the circuit board 500 with other elements are the same as in the third embodiment. In this embodiment, the circuit board 500 divides the space formed by the base plate 30 and the back cover 40 into two subspaces. The driver module 520 and the electronic element 540, both requiring more heat dissipation are disposed in the subspace near the vents 80, 81, and the electronic element 541 (the second electronic element) requiring less heat dissipation is disposed in another subspace.

Fifth Embodiment

Figure 7:
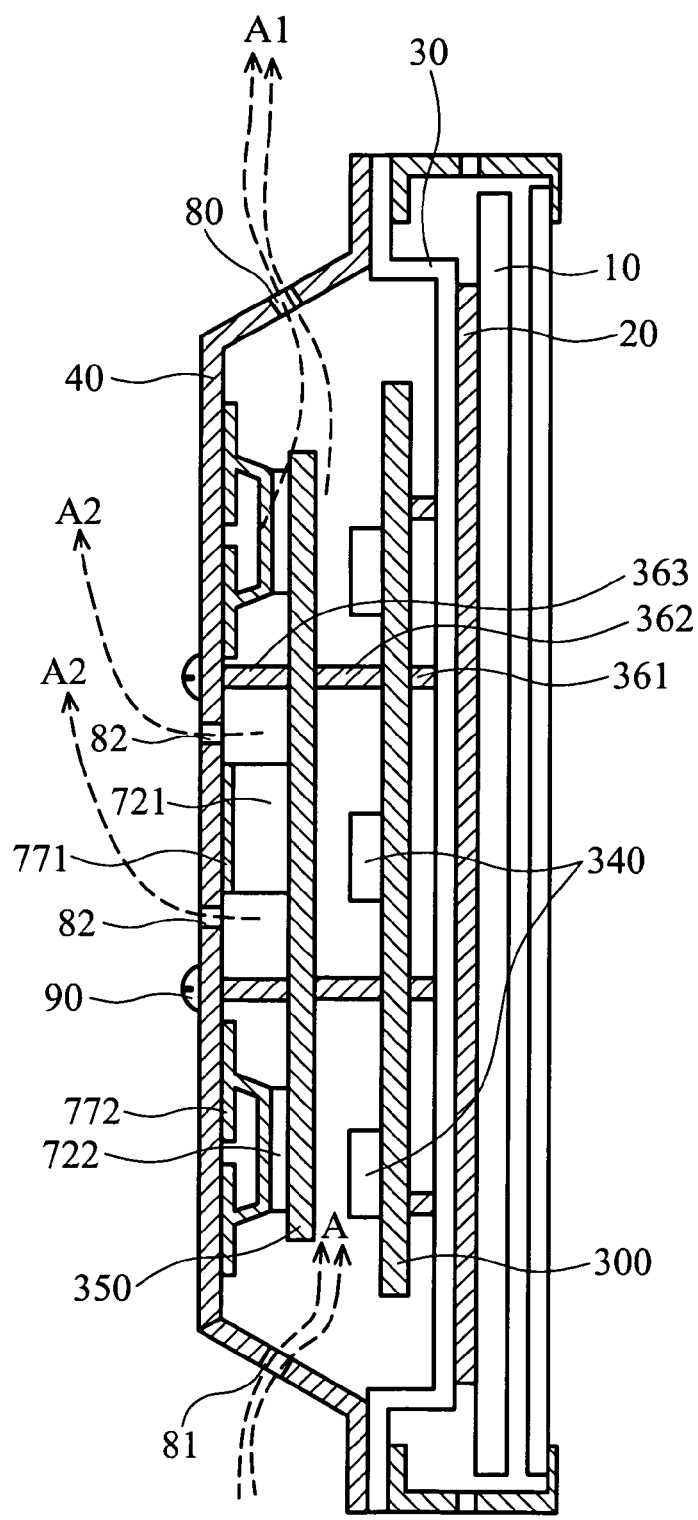
FIG. 7 is a cross section of the fifth embodiment of the plasma display of the invention.

This embodiment combines the first and the third embodiments. As shown in FIG. 7, the first circuit board 350 bears a driver module 721 and a driver module (the fourth electronic element) 722 different from the driver module 721 in height. The driver module 721 makes thermal contact with the back cover 40 via a thermal pad 771, and the driver module 722 makes thermal contact with the back cover 40 via a thermal conductive spring element 772. Other elements are the same as the first embodiment.

The invention provides divided areas for electronic elements requiring different heat dissipation and provides dedicated heat sink mechanism for the electronic elements requiring more heat dissipation to enhance the individual heat dissipation of electronic elements as well as improve the overall heat dissipation efficiency of the plasma display.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A plasma display, comprising:
   a base plate;
   a back cover engaged with the base plate to form a space;
   a first circuit board disposed in the space and mounted on the base plate;
   a first electronic element disposed on the first circuit board;
   a first thermal conductive device disposed between the first electronic element and the back cover and mounted on the first electronic element, wherein the first thermal conductive device comprises a thermal conductive spring element, being substantially U-shaped, having at least one spring leg being substantially linear and extending toward the back cover and at least one contact plate connected to the spring leg and abutting the back cover.

2. The plasma display as claimed in claim 1, wherein the spring leg is integrally formed with the contact plate.

3. The plasma display as claimed in claim 1, wherein the thermal conductive spring element comprises copper.

4. The plasma display as claimed in 1, wherein the base plate is a metal plate.

5. The plasma display as claimed in claim 4, wherein the metal plate is made of at least one of aluminum, copper or other compound metal.

6. The plasma display as claimed in claim 5 farther comprising a plurality of first supporters disposed between and separating the first circuit board and the base plate by an appropriate distance.

7. The plasma display as claimed in claim 6 farther comprising a second electronic element disposed on the first circuit board opposite to the first electronic element.

8. The plasma display as claimed in claim 5 farther comprising:
 a second circuit board mounted between the first circuit board and the base plate;
 a third electronic element disposed on the second circuit board and positioned between the first circuit board and the second circuit board.

9. The plasma display as claimed in claim 8 further comprising a fourth electronic element disposed on the first circuit board; and a second thermal conductive device disposed between the fourth electronic element and the back cover and mounted on the fourth electronic element.

10. The plasma display as claimed in claim 9, wherein the second thermal device comprises a thermal conductive spring element.

11. The plasma display as claimed in claim 10, wherein the thermal conductive spring element has a spring leg secured on the first electronic element and a contact portion abutting the back cover.

12. The plasma display as claimed in claim 11, wherein the spring leg is integrally formed with the contact portion.

13. The plasma display as claimed in claim 10, wherein the thermal conductive spring element comprises copper.

14. The plasma display as claimed in claim 8, wherein the second circuit board is mounted on the base plate.

15. The plasma display as claimed in claim 14 further comprising a fifth electronic element disposed on the first circuit board opposite to the first electronic element.

\* \* \* \* \*